United States Patent [19]

Rouge

[11] Patent Number: 4,524,239

[45] Date of Patent: Jun. 18, 1985

[54] MULTI-LAYER ELECTRIC CIRCUIT BOARD AND BLANKS THEREFOR

[76] Inventor: Francois Rouge, 27, rue Audran, 94400 Vitry sur Seine, France

[21] Appl. No.: 413,456

[22] Filed: Aug. 31, 1982

[30] Foreign Application Priority Data

Sep. 2, 1981 [FR] France .............................. 81 16718

[51] Int. Cl.$^3$ .............................................. H05K 1/14
[52] U.S. Cl. ..................................... 174/68.5; 361/414
[58] Field of Search ......................... 361/414; 174/68.5

[56] References Cited

U.S. PATENT DOCUMENTS

| | | | |
|---|---|---|---|
| 3,895,181 | 7/1975 | LaGrange et al. | 361/414 X |
| 4,150,421 | 4/1979 | Nishihara | 361/414 X |
| 4,434,321 | 2/1984 | Betts | 361/414 X |
| 4,438,560 | 3/1984 | Kisters | 174/68.5 X |

FOREIGN PATENT DOCUMENTS

| | | |
|---|---|---|
| 2929950 | 2/1980 | Fed. Rep. of Germany . |
| 1157432 | 7/1969 | United Kingdom ................ 361/414 |
| 2039153 | 7/1980 | United Kingdom ................ 361/414 |
| 2045538 | 10/1980 | United Kingdom . |

*Primary Examiner*—R. R. Kucia
*Attorney, Agent, or Firm*—Larson and Taylor

[57] ABSTRACT

A multi-layer blank for an electrical circuit board has at least one internal layer, which may constitute a common power supply or ground plane. The inner layer consists of an electrically conductive network extending throughout the area of the inner layer and formed by the repetition of an elementary predetermined pattern in two orthogonal directions. The elementary pattern has such a shape that adjacent patterns are in electrical contact so that the network is equipotential. The pattern is also of such a shape that there is formed a first regular grid of predetermined pitch p whose nodes constitute insulated sites and a second grid off-set by p/2 from the first grid in at least one of the orthogonal directions. The second grid has the same pitch p as the first one and has nodes one at least of which per elementary pattern is insulated while the other ones belong to the conducting network.

8 Claims, 5 Drawing Figures

MULTI-LAYER ELECTRIC CIRCUIT BOARD AND BLANKS THEREFOR

BACKGROUND AND SUMMARY OF THE INVENTION

The present invention relates to the production of multi-layer blanks for electric circuit board and it is particularly, although not exclusively, suitable for the production of multi-layer printed or "written" circuits for receiving packages of logic circuits, such as DIP.

The majority of multi-layer printed circuit blanks available at present are manufactured by pressing a sandwich having internal layers, intended to constitute common ground and electrical supply planes, printed in advance according to a tracing defined by the customer. The logic connections are effected on the other layers and the connections between one face and the other (or an internal layer) by metal coated through holes. This solution has drawbacks: it is necessary to define an internal layer artwork for each particular need, whence high cost since design work has to be repeated for each circuit, even if the quantities are small. The excess blanks cannot be used for other systems.

Multi-layer boards are also known whose inner layers are predefined and have a standard outline. However, such board blanks also have drawbacks. They impose restrictions as to the place of the packages, which limits their field of use and reduces the maximum density of implantation of external packages.

In summary, existing blanks do not constitute standard components usable to produce any type of circuit. It is not possible to use these blanks as a conventional double face board with plated through holes, since conditions as to the locations where connecting holes may be formed between the surfaces must be respected. It is not possible to store the inner layers as pre-pressed cards. Finally, when the blank is of the type having supply and ground layers of predetermined outline, the density of implantation and interconnection is reduced; in particular, it is not possible to locate components at all nodes of the standard grid with a pitch of 2.54 mm or 0.1 in.

It is an object of the invention to provide improved blanks for the production of multi-layer electrical circuit boards. It is a more specific object to reduce the design cost, due to the use of a standard blank, and the production costs of the blank, due to manufacture on a larger scale; it is still another object of the invention to authorize large integration densities due to the possibility to locate chips at all nodes of a standard grid or network and to remove conditions as regards the positioning of the plated holes.

For that purpose, a blank for a multi-layer electrical circuit board comprises an insulating flat substrate containing at least one inner layer, parallel to the faces of the substrate and having an electrically conducting network extending over the whole surface of the layer and formed by the repetition in two dimensions of an elementary pattern. That repetition defines a first grid of constant pitch p whose nodes are non-conducting sites and defines a second grid of pitch p, off-set by p/2 with respect to the first, having nodes at least one of which per elementary pattern is non-conducting and the other of which belong to the conducting network. A connection can consequently be made between the internal layer and a component borne by the support by means of a plated hole located at any one of said other sites.

Such a blank can be produced on an industrial scale conventionally by pressing or rolling. Due to the continuous nature of the conducting network, the connection has an impedance which is substantially the same whatever the position of the node.

The blank will typically comprise two parallel inner layers, one of which will constitute a common ground plane and the other the common supply plane; their grids will be off-set by p along one of the dimensions of the network. Thus, a connection may easily be made by a plated through hole between the two outer surfaces of the blank in any one of the nodes of the first grid; a connection with the supply or ground may be made with a plated hole at a node of the second grid.

The or each conduction network may consist, at each of said other nodes, of an annular metal area defining a central circular opening of sufficient diameter to permit drilling of a small diameter hole connecting the opposed surfaces without however forming a connection with the network. The elementary pattern can have three of said other nodes, off-set by a half step p/2 in two directions at right angles with respect to the first sites on which the chips will be connected.

Manufacturing of double face multi-layer boards from a blank of the above-defined type may be as follows: the connections between the opposed faces are made by means of plated holes which can be drilled at any one of the sites of the first grid. If said other nodes include electrically conducting zones which are annular rather than fully circular, it is possible to connect the opposed faces by means of a plated hole of diameter less than that of the inner circle of the zone. The connections between one face and the inner layer can be made by a plated hole drilled at one of the other sites. When two internal layers are provided, connection with one of the layers will be formed by drilling and plating a hole at one of those of said other sites of one of the layers which are opposite that of the sites of the second layer which is non-conducting.

The invention will be better understood from the following description of particular embodiments given by way of examples.

SHORT DESCRIPTION OF THE DRAWINGS

Figure 1:
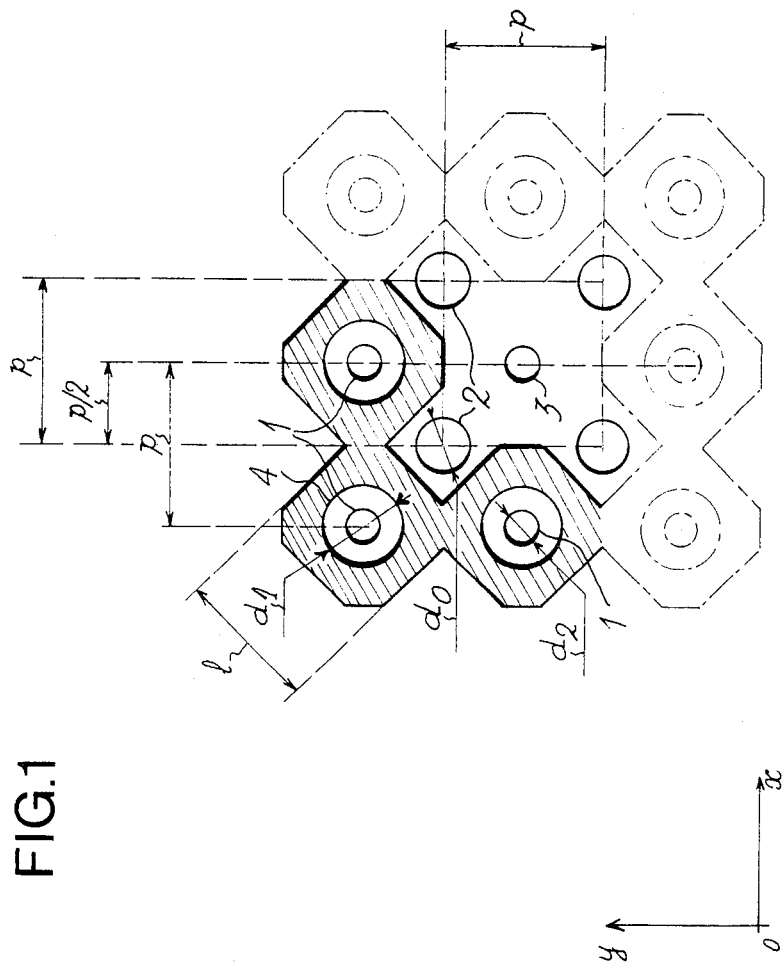
FIG. 1 is a plan view showing a fragment of the conductive network of an inner layer of a blank according to a first embodiment of the invention.
Figure 2:
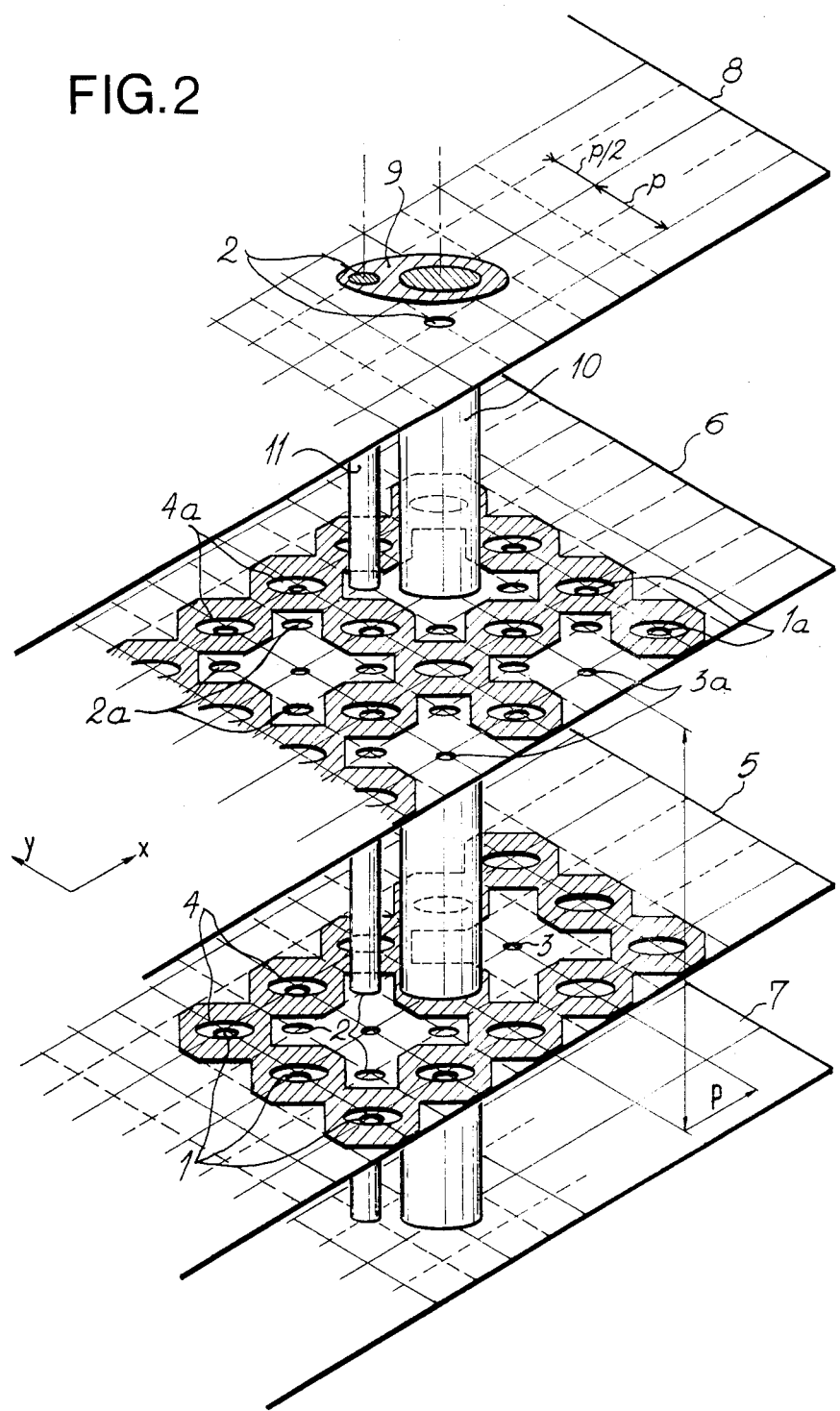
FIG. 2 is an isometric exploded view which shows a portion of the faces and of the inner layers of a printed circuit board blank using pattern units of the type shown in FIG. 1, as well as an example of connection.
Figure 3:
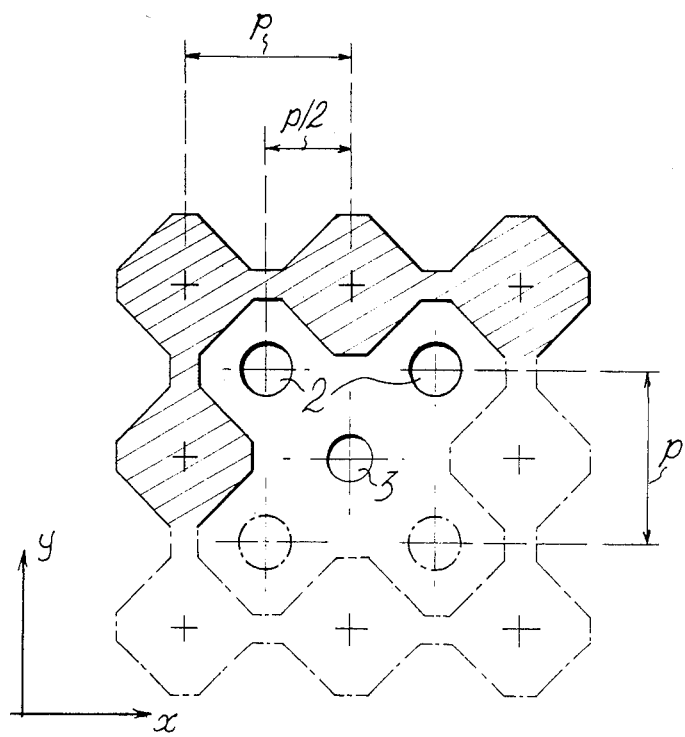
Figure 4:
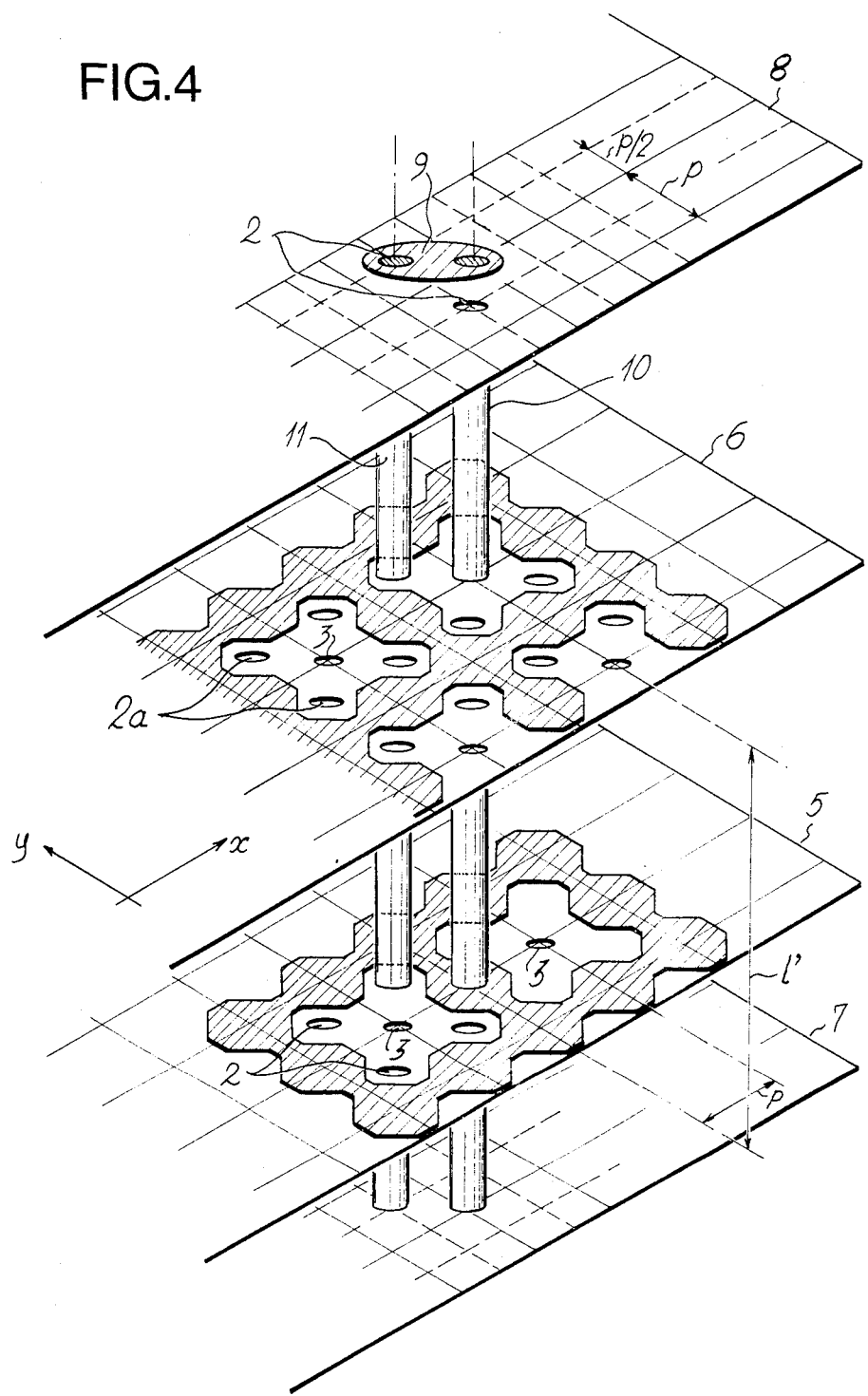

FIGS. 3 and 4, similar to FIGS. 1 and 2, show a modified embodiment adapted to the constitution of logic boards on which equipotential junctions are formed by means of welded and bonded insulated wires.

Figure 5:
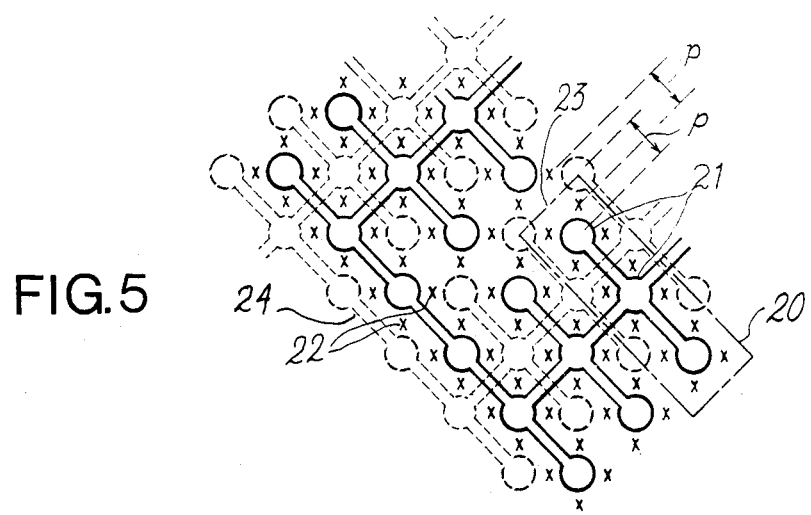

FIG. 5 is a partial planar view of yet another embodiment.

DETAILED DESCRIPTION OF PREFERRED EMBODIMENTS

An embodiment of the invention will first be described which is suitable for manufacture of multi-layer printed circuit board blanks for carrying logic circuit packages. The blank is in the form of a flat support of insulating material which will bear, on its two opposed outer faces, printed tracks or insulated wires of conducting material. Two inner conducting layers parallel to the faces are formed in the thickness of the support.

Each of the inner layers consists of a continuous electrically conducting network formed by a thin metallic layer. This network is constituted by the repetition, in two dimensions, of an elementary pattern unit indicated in solid lines in FIG. 1. This unit constituted by a thin metallic layer, is in the form of juxtaposed squares centered on the nodes or branch points of a regular square network of pitch p along two orthogonal directions OX and OY. The pitch p will typically be the standard implantation pitch of 2.54 mm used for the implantation of logic circuit packages on a board. The length l of the sides of the squares is such that their corners join to ensure electrical continuity. If the pitch p is of 2.54 mm for instance, the distance between opposite sides will for example be 2.2 mm.

Repetition of the pattern unit along directions Ox and Oy results in a first grid of constant pitch p between the nodes which are off-set by p/2 with respect to the nodes or branch points of the conductive network. The area located around each of the branch points of this first grid constitutes non-conducting sides 2. A plated hole drilled through the board at any one of the sites 2 does not contact any conducting zone of the layer and connects the opposed outer faces, provided that it is of sufficiently small diameter. In practice, to take into account manufacturing tolerances and centering errors during piercing, it is possible to consider that the metallized holes pierced at the sites 2 should not exceed a diameter $d_0$ of 0.8 mm in the case of a pitch p of 2.54 mm.

Each of the units shown in FIG. 1 defines at its four additional sites, off-set in the two directions OX and OY by p/2 with respect to the sites 2. Three of the sites, denoted by the reference 1, are at the center of conducting areas having an approximately square outer periphery. The fourth, denoted by 3, occupies a place where a conducting square does not exist in the pattern. A metallized hole pierced at the site 3 will not encounter conducting zones of the network, provided that it is of sufficiently small diameter.

In the embodiment shown in FIG. 1, the conducting part in each square is limited to an annular zone whose outer perimeter is constituted by the square and whose inner perimeter is constituted by a circle 4 of diameter $d_1$. Under these conditions, a metallized hole pierced through the plate at any one of the sites 1 will not encounter a conducting zone if the diameter $d_2$ is sufficiently small. In practice, in the case of a pitch p of 2.54 mm, it will be possible to chose values of 1.4 mm and 0.5 mm for $d_1$ and the maximum value of $d_2$, respectively.

FIG. 2 shows the most frequent case where the blank comprises two inner layers 5 and 6, respectively constituting a common ground plane and a common supply plane at voltage Vcc, parallel to the terminal surfaces 7 and 8. In this case, each of the layers has the constitution shown in FIG. 1, but the pattern units of the one are off-set with respect to the pattern units of the other by p in one of the directions, which will be assumed to be Ox. For greater simplicity, the reference numerals used in FIG. 1 have been repeated in FIG. 2, associated with the index a when they relate to the layer 6.

To interconnect areas situated on the opposite outer surfaces of the circuit, it suffices to drill a through hole whose diameter is sufficiently small not to overlap over a conducting zone at any one of the sites 1, 2 and 3 and to plate this hole.

A connection between the terminal surfaces and the ground plane will be formed by piercing a hole of sufficiently large diameter (typically 1.8 mm in the case of a pitch of 2.54 mm) in any one of the sites 3a of the conducting network of the layer 6 and by metallizing it. The plated wall of this hole will not be in contact with a conducting zone of the conducting network of the layer 6. On the other hand, it will be in contact with the conducting annular zone around one of the sites 1 of the network of the layer 5. To effect a junction between a component fixed on the surface 8, at a site 2 of the implantation network and the ground plane, it suffices to create a conducting track 9 to the zone surrounding the opening of the metallized hole 10 connecting with the ground plane. This track can be connected to the surface 7 by a plated hole 11 which, provided that it does not have a diameter greater than $d_0$, will not come into contact either with the ground plane, nor with the supply plane.

The junctions between one of the surfaces 7 and 8 and the supply plane are formed, as in the preceding case; however plated holes of sufficient diameter are pierced at one of the sites 3 of the network of the layer 5.

The invention is in no way limited to the particular embodiment shown and described by way of example. The pattern units may have very different shapes from those which have been illustrated. The blank may be intended for the constitution of circuits including, on the terminal surfaces, not printed tracks, but insulated wire connections soldered at their ends and which can be bonded to the terminal surfaces throughout their length.

FIGS. 3 and 4 show a blank according to a first modification, intended for the constitution of circuits by forming equipotential connections required by means of soldered insulated wires. In this modification, the elementary pattern unit (FIG. 3) has the same general shape as that of FIG. 1, but:

the sites 1 belonging to the conducting network are solid rather than annular areas, the traversing holes 4 provided in FIGS. 1 and 2 not being necessary;

for this reason, it is possible to adopt a conducting network whose individual conducting zones have a smaller area.

It is possible, for example, to adopt for a pitch p of 2.54 mm, a width l' of 1.4 mm, which permits the metallized connecting holes 10 at the sites 3 between the terminal surfaces and one of the common planes, to be given a diameter ranging up to 1 mm with the usual centering tolerances. The diameter of the connecting holes 11 between the surfaces, intended for the component lugs, pierced at sites 2, will in practice range up to 1.2 mm. The terminal surfaces 7 and 8 will be constituted by layers whose nature will depend on the type of equipotential connection selected, which may for example be that known under the trademark "MULTI-WIRE". The inner layers 5 and 6 are again off-set from one another by p in the direction x.

FIG. 5, which relates to another embodiment, shows in full lines the network on one of the layers, in dashed lines the network on the other layer. Each network is constituted by the repetition of the same pattern unit, surrounded by a dash-dot frame. It is seen that each network frees a first grid with square mesh, of pitch p, constituted by non-conducting sites 22. It constitutes a second grid, off-set by p/2 with respect to the first in the two orthogonal directions of the network; the nodes of this second grid include, for each pattern unit, non-conducting sites 23 and sites 21 belonging to the conducting network. Conducting connecting tracks 24 are provided along the edges of the network to ensure electrical continuity.

I claim:

1. A blank for a multi-layer electrical circuit board, comprising an electrically insulating flat substrate having two outer faces and at least one inner layer in said substrate, parallel to said faces and having an electrically conductive network extending throughout the area of said inner layer and formed by the repetition of an elementary predetermined pattern with a predetermined pitch 2p in two orthogonal directions, said predetermined pattern being of such shape that adjacent patterns are in electrical contact and that said inner layer has a first regular grid of predetermined pitch p whose nodes constitute insulated sites and a second grid of pitch p which is off-set by p/2 from the first grid in at least one of said directions, having nodes one at least of which per elementary pattern unit is insulated while the other one belong to the conductive network.

2. A blank according to claim 1, comprising two of said inner layers, whose grids are off-set by p along one of said orthogonal directions.

3. A blank according to claim 2, wherein one of said inner layers constitutes a common ground plane and the other one constitutes a common power supply plane.

4. A blank according to claim 1, wherein each said other sites has an electrically conducting annular zone which defines a central substantially circular aperture having a sufficient diameter for drilling a plated hole connecting said outer faces without contact with the conductive network at said sites.

5. A blank for a multi-layer electrical circuit board, comprising an electrically insulating flat substrate having two outer faces and at least one inner layer in said substrate, parallel to said faces and having an electrically conductive network extending throughout the area of said inner layer and formed by the repetition of a predetermined elementary pattern in two orthogonal directions, said predetermined elementary pattern comprising three adjacent electrically conductive areas of substantially square outer shape and substantially circular inner shape centered on three out of four nodes of a first square lattice having a pitch, said square outer shape being of such size that adjacent ones of said areas are in mutual electrical contact and define insulating sites between said areas which are distributed at all nodes of a second square lattice of pitch p which is off-set by p/2 from the first lattice in both said directions, said insulating sites being of sufficient size for providing room for conducting holes through said insulating sites without contact with the surrounding ones of said electrically conductive areas.

6. A blank for a multi-layer electrical circuit board, comprising an electrically insulating flat substrate having two outer faces and at least two inner layers in said substrate, parallel to said faces, each of said inner layers having an electrically conductive network extending throughout the area of said inner layer and formed by the repetition of a predetermined elementary pattern with a predetermined pitch 2p in two orthogonal directions, said predetermined elementary pattern comprising the three adjacent electrically conductive areas of substantially square outer shape and circular inner shape centered on three out of four nodes of a first square lattice having a pitch equal to p, said square outer shape being of such size that adjacent ones of said areas are in mutual electrical contact and define insulating sites between said areas which are distributed at all nodes of a second square lattice of pitch p which is off-set by p/2 from the first lattice in both said directions, said insulating sites being of sufficient size for providing room for conducting holes through said insulating sites without contact with adjacent ones of said electrically conductive areas, wherein the lattices in one of said inner layers are offset with respect to those in the other of said unit layers by p along one of said orthogonal directions.

7. A blank according to claim 6, wherein each of said electrically conductive areas has an electrically conducting annular zone which defines a substantially cental circular aperture having a sufficient diameter for drilling a plated hole connecting said outer faces without contact with the conductive network.

8. A blank according to claim 6, wherein each of said electrically conductive areas has an approximately square outer periphery with the sides of the square at 45° from said predetermined directions.

* * * * *